United States Patent
Chen et al.

(10) Patent No.: US 7,516,427 B2
(45) Date of Patent: Apr. 7, 2009

(54) INPUT CAPACITANCE CHARACTERIZATION METHOD IN IP LIBRARY

(75) Inventors: Peter H. Chen, Taoyuan (TW); Han-Chi Liu, Kaohsiung (TW); Chih-Yang Peng, Pingjhen (TW); Jyh-Herng Wang, Cyonglin Township, Hsinchu County (TW); Chia-Nan Hong, Hsinchu (TW)

(73) Assignee: Faraday Technology Corp, Hsinchu (TW)

( * ) Notice: Subject to any disclaimer, the term of this patent is extended or adjusted under 35 U.S.C. 154(b) by 436 days.

(21) Appl. No.: 11/197,820

(22) Filed: Aug. 5, 2005

(65) Prior Publication Data

US 2007/0033547 A1    Feb. 8, 2007

(51) Int. Cl.
*G06F 17/50* (2006.01)

(52) U.S. Cl. .............................. 716/4; 716/5
(58) Field of Classification Search .................... 716/1, 716/4–5, 7–10; 703/13–15, 18–20
See application file for complete search history.

(56) References Cited

U.S. PATENT DOCUMENTS

| | | | | |
|---|---|---|---|---|
| 6,249,901 B1* | 6/2001 | Yuan et al. | ...................... | 716/5 |
| 6,499,129 B1* | 12/2002 | Srinivasan et al. | ............. | 716/4 |
| 2006/0271889 A1* | 11/2006 | Chen et al. | ...................... | 716/5 |

OTHER PUBLICATIONS

"A Fast Methodology Flow for IP Input and Max Output Cap Characterization" By Peter H. Chen et al. / SNUG Taiwan 2005 / p. 1-17.

* cited by examiner

*Primary Examiner*—Paul Dinh
(74) *Attorney, Agent, or Firm*—J.C. Patents

(57) ABSTRACT

A methodology for characterization of an IP (Intellectual Property) component is provided. Digital pins are recognized by skipping analog pins and special IO pins. First two layers of the IP component are classified in response to connection of the input pins. Partial circuits of the IP component are extracted for simulation. Three corners of IP library are generated. Therefore, input capacitance of the IP component is simulated.

20 Claims, 4 Drawing Sheets

INPUT CAPACITANCE CHARACTERIZATION METHOD IN IP LIBRARY

BACKGROUND OF THE INVENTION

1. Field of Invention

The present invention relates to an IP (intellectual property) characterization methodology. More particularly, the present invention relates to an input capacitance characterization methodology of an IP component by circuit recognition, extraction, and simulation.

2. Description of Related Art

Electronic design automation (EDA) system is a form of computer aided design (CAD) system and is used for designing integrated circuit (IC) devices. The EDA system typically receives one or more high level behavioral descriptions of an IC device (e.g., in HDL languages like VHDL, Verilog, HSPICE, and etc.) and translates this high level behavioral descriptions into netlists of various levels of abstraction. At a higher level of abstraction, a generic netlist is typically produced based on library primitives. The generic netlist can be translated into a lower level technology-specific netlist based on a technology-specific library. A netlist, describing the IC design, is composed of nodes (elements) and edges, e.g. connections between nodes, and can be represented using a directed cyclic graph structure having nodes connected to each other with signal lines. A single node can have multiple fan-ins and multiple fan-outs. The netlist is typically stored in computer readable media within the EDA system and processed and verified using many well known techniques. One result is a physical mask layout to directly implement structures in silicon to realize the physical IC device.

In developing IC, different kinds of automation tools played significant roles in, such as function verification, layout, electricity analysis and simulation.

In addition, in order to meet the requirements of more intensive circuitry and fewer development cycles, how to develop an economical IC has become a major topic for development engineers now, and circuitry design reusing is one of the useful techniques. In other words, by reusing, well designed functional circuitries can be repeatedly used to build up a new Application Specific Integrated Circuit (ASIC). Therefore, the IC development process can be completed faster. Here, the well designed circuitry layout that can be repeatedly used is also known as an IP (Intellectual Property) component.

In general, characteristic of the IP component is estimated when the IP component is completed. In use of the IP component, the manual characterization of the IP component may be not completed.

In the prior art, various characterization data are determined and provided by development engineers based on their own professional knowledge and working experience, and the characterization data are sequentially and manually input into the system with the help of a simulation program so as to obtain simulation reports. Key values (e.g. timing, power, etc.) are manually extracted from the simulation reports, and the extracted key values are manually keyed in to generate an IP characteristic library for subsequent development process. Furthermore, for considering time efficiency, in the manually input, it is impossible/impractical to obtain the complete characterization data. Some manual guess or manual interpolation of faked data are mixed into a release library and thus a complete or correct IP characteristic library cannot be obtained.

As IP designs grow bigger, IPs may contain more than 500K transistors. The growing number of transistors increases the difficulty for circuit simulation software, such as SPICE, in solving the circuit matrix; thereby the non-convergence problem is very common for more 90% of IPs. Besides, the time-to-market of IP delivery and ASIC design is critical. As the size of IP grows bigger and simulation run-time grows exponentially. This is an NP (Non-Polynomial) problem. So, it is impractical to get the input and output capacitance through the whole IP simulation. Some tools provide I-V curve or circuit simplification to reduce the run-time; however, the accuracy is not good enough and the reduction in run-time is limited. Besides, the cost of those licenses is another concern.

For non-standard cells, models of SPICE or other simulation software are used to analyze the target cell for obtaining characteristics. If the target cell under simulation is very complicated, the simulation time is exponentially and dramatically increased. Accordingly, the use of the SPICE simulation software to analyze the input capacitance characterization of the target cell, such as the IP cell, wastes a lot of time and becomes impractical/impossible.

A fast and generic algorithm for IP characterization, i.e., input capacitance characterization, with partial circuit extraction and simulation is desired.

SUMMARY OF THE INVENTION

In one aspect of the invention, automation of double layer recognition, extraction and simulation is made.

In another aspect of the invention, a fast methodology flow to cut down the simulation time from weeks/months to seconds is provided.

In one embodiment of the invention, a methodology for characterization of an IP (Intellectual Property) component is provided. In the methodology, digital pins are recognized by skipping analog pins and special IO pins. First two layers of the IP component are classified in response to connection of the input pins. Partial circuits of the IP component are extracted for simulation. Three corners (typical case, best case and worst case) of IP library are generated.

In another embodiment of the invention, a methodology for estimating input capacitance of an IP (Intellectual Property) component is disclosed. The methodology discloses selecting digital pins by skipping analog pins and special IO pins; identifying connection of input pins to extract first two layers of the IP component; neglecting capacitance from a third layer to output pins of the IP component; and finding the input capacitance of the first two layers by simulation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
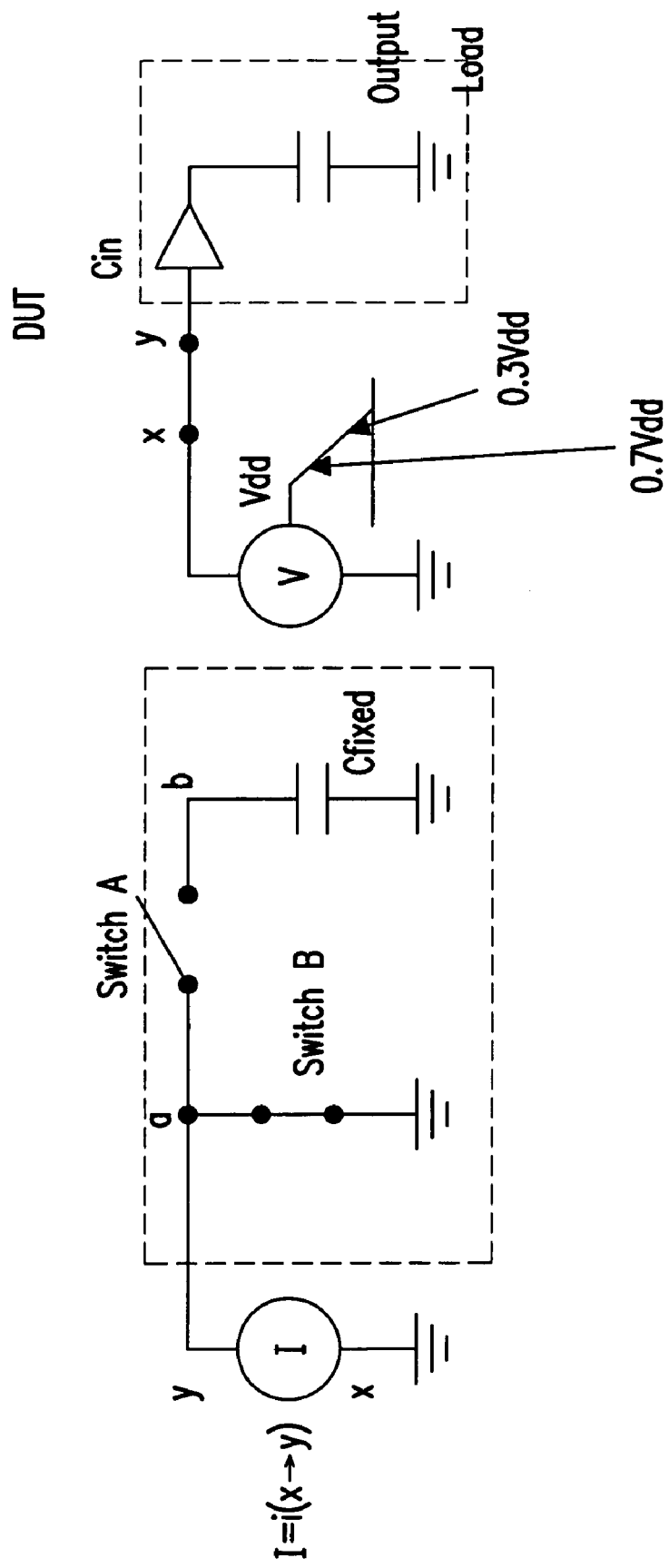
FIG. 1 is a mirror circuit of VCR switch and device under test according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Partial Circuit Extraction and Simulation

In one embodiment of the invention, partial circuit extraction and circuit simulation are used to find the input capacitance of IP cell. FIG. 1 is a mirror circuit of VCR (voltage-controlled resistance) switch and device under test (DUT) according to one preferred embodiment of the present invention. Because it is difficult to directly measure current from node x to node y, so the mirror circuit of the VCR switches is used to simulate the current from node x to node y.

The mirror circuit includes a current source I, switches A and B and a capacitor with a capacitance of Cfixed (Cfixed had better be the bigger order for DUT to charge and discharge). In FIG. 1, DUT refers to device (or IP) under test (or simulation); switches A and B are VCR (voltage-controlled resistance) switches, V refers to a voltage source varying within Vdd~0, Cin refers to effective capacitance of first two layers of DUT and output load refers to standard cells connected to DUT. Vdd means a power supply. Alternatively, Cin is the downstream capacitance of DUT and loading capacitance.

Figure 2:
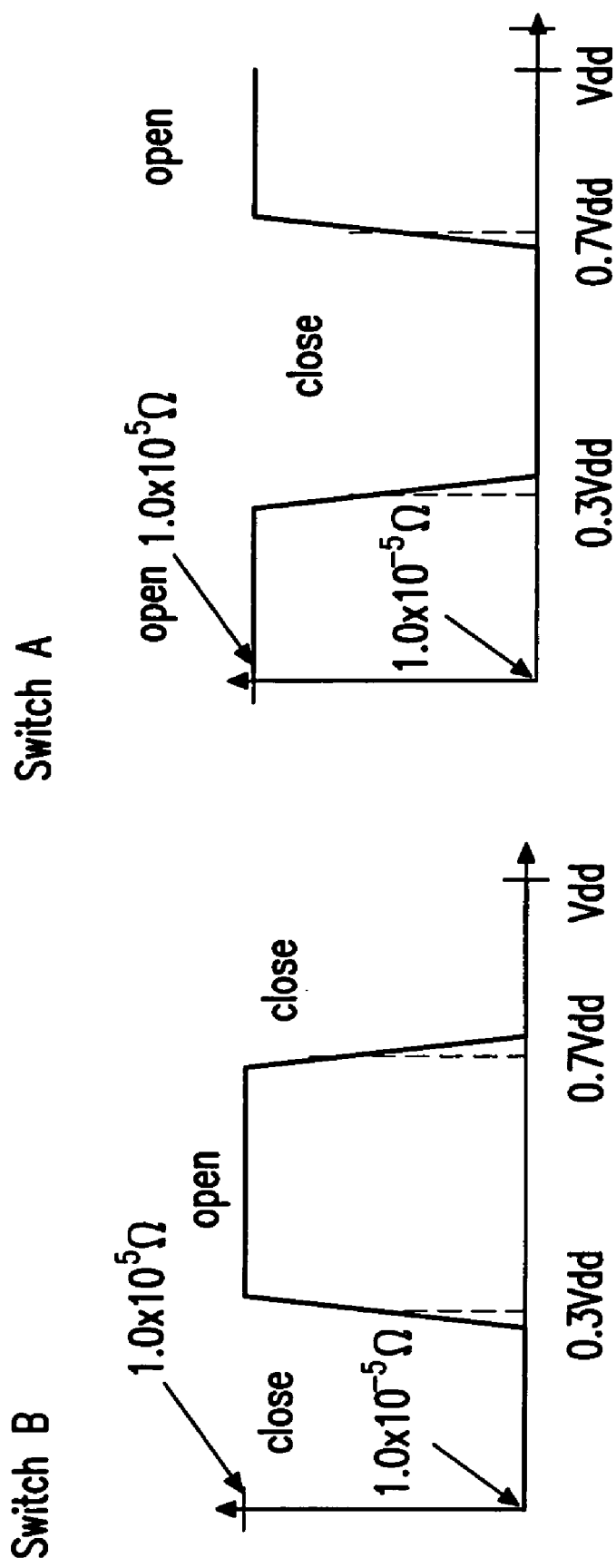
FIG. 2 shows the relation of the voltage and resistance of VCR switches A and B.

In FIG. 1, the VCR-based switches are used to control connection/disconnection between the current source I and the capacitor Cfixed. FIG. 2 shows the relation of the voltage applied and resistance of VCR switches A and B. As shown in FIG. 2, the resistance of switches A and B are controlled by voltages applied. Switches are open or closed depending the applied voltage and independent of time. The switch A is open during 0~0.3Vdd or above 0.7Vdd and closed during 0.3Vdd~0.7Vdd. Similarly, the switch B is closed during 0~0.3Vdd or above 0.7Vdd and open during 0.3Vdd~0.7Vdd.

Figure 3:
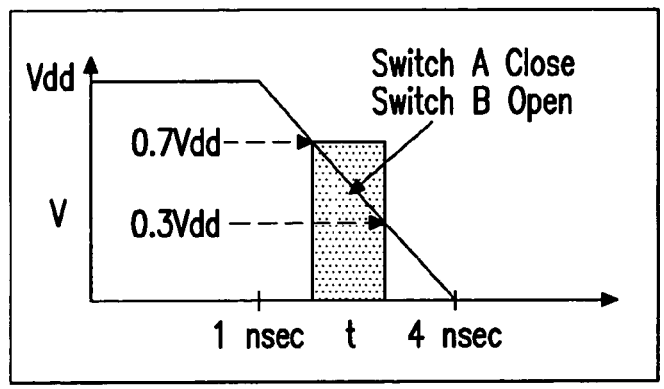
FIG. 3 shows a waveform of the voltage applied to the DUT.

FIG. 3 shows a waveform of the voltage V applied to the DUT between 1 to 4 ns (nano-second). During a period t, $0.7*Vdd \leq V \leq 0.3*Vdd$. In other words, the switch A is closed and the switch B is open during t.

Initially, the switch A is open and the switch B is closed when V>0.7*Vdd as shown in FIG. 1. V starts to charge DUT with current when $0.3*Vdd \leq V \leq 0.7*Vdd$ because switch A is closed and switch B is open.

It is known $Q = I*t = V*C$  (1)

On the switch side, a charge quantity Q is expressed by $Q = \max(Vb)*Cfixed$  (2)

On the DUT side, Q is alternatively expressed by $Q = \int_{0.3Vdd}^{0.7Vdd} Cin\, dV = 0.4Vdd*Cin$  (3)

From the above equations (2) and (3), it is concluded $Q = \max(Vb)*Cfixed \approx 0.4Vdd*Cin$  (4)

Therefore, Cin is expressed by $Cin \approx \max(Vb)*Cfixed/0.4Vdd$  (5)

From above equations (1)~(5), Cin, an effective input capacitance of the IP component, is simulated.

Device Extraction for Two Layers of Devices

The first two layers of the DUT are extracted to represent the input capacitance of the entire DUT. The capacitive effects from the third layer to the output pins of DUT are neglected. This is similar to the standard cell characterization. In standard cell characterization, only first layer is considered and the second layer is represented by an output loading.

Figure 4:
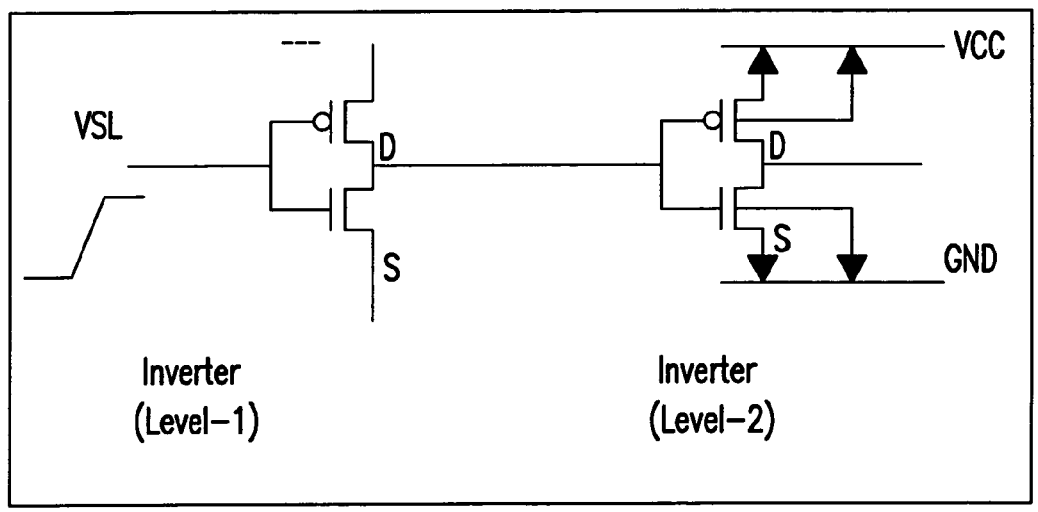
FIG. 4 shows double layers of two cascaded inverters.
Figure 5:
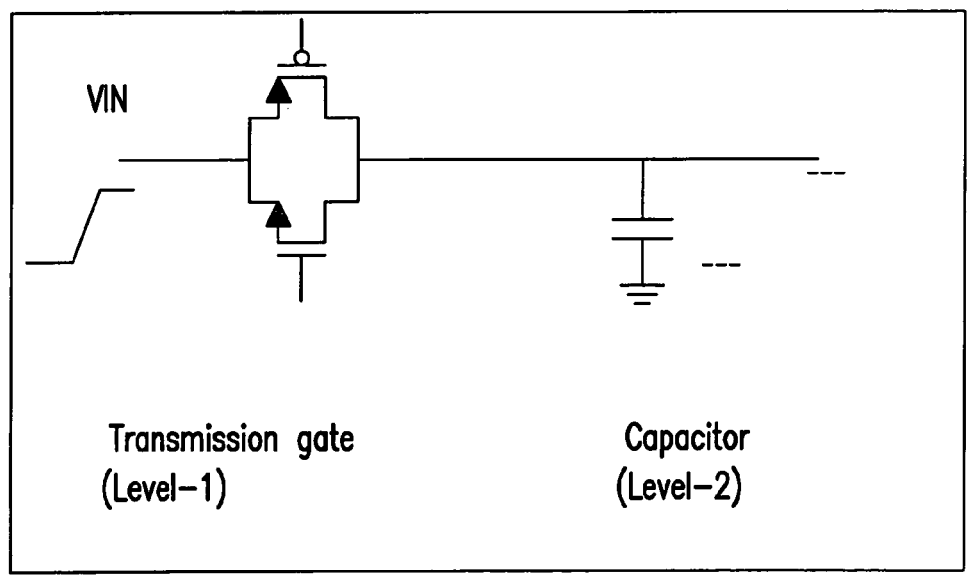
FIG. 5 shows double layers of cascaded transmission gate and capacitor.

There are at least two kinds of circuit recognition, for example, double inverters or a transmission gate plus a capacitor. In order to extract circuit correctly, circuit type is recognized first. IP designer's intension to tie to logic high (power) or logic low (ground) also needs to be considered. FIGS. 4 and 5 show two kinds of double layers of an IP component, one for two cascaded inverters and one for a transmission gate and a capacitor.

The first level (or layer) of input circuit contains the inverter or the transmission gate. If the first level is an inverter, the second layer will be another inverter. If the first level is a transmission gate, the second layer will be a capacitor.

To search for the input for the first layer, all the input pins and IO pins are looped. If the input pin is connected to a gate of the first layer, then the first layer is recognized to be an inverter cell. If the input is connected to a source or drain terminal of the first layer, then the first layer is recognized to be a transmission gate.

To search for the input for the second layer, all the input pins and IO pins are looped.

If the first layer is an inverter, the output of the first layer is connected to the gate of the second layer. The source or drain of the second layer is pulled to Logic High or Low. To find the appropriate power level, if the designer already specifies the power level, such as 3.3V or 1.8 V, respectively, then the designer's value is used; otherwise, the device naming rule is used to determine the power level.

As described above, if the first layer is a transmission gate, then the second layer will be a capacitor. As shown in FIG. 5, one terminal of the second layer (the capacitor) will be connected to the output terminal of the first layer (the transmission gate). The other terminal of the second layer (the capacitor) will be grounded, as shown in FIG. 5.

Note that some pins are reserved for resistance testing purpose (to determine the voltage level, for example) in some IPs (such as Band Gap for stable reference voltage). Those pins are not characterized and will be partially or totally burned in the final delivery. The SPICE netlist should be clean up.

The transmission gate may be a CMOS (complementary metal oxide semiconductor) circuit or just an NMOS (N-channel metal oxide semiconductor) or PMOS (P-channel metal oxide semiconductor) circuit only. During the extraction, the gate port on the transmission gate is set to Logic High (Power) if an NMOS circuit and set to Logic Low (Ground) if a PMOS circuit. However, in cases where the input pin is disabled, the gate port will be tied to high or ground.

In order to prevent DC path error caused by device floating, the output of the second-level device has to be disconnected and tied to high or low during the device extraction. In the second-level inverter, if S (Source) or D (Drain) has the same name as the substrate (B), then the S or D has to be tied to high for PMOS and tied to low for NMOS.

Figure 6:
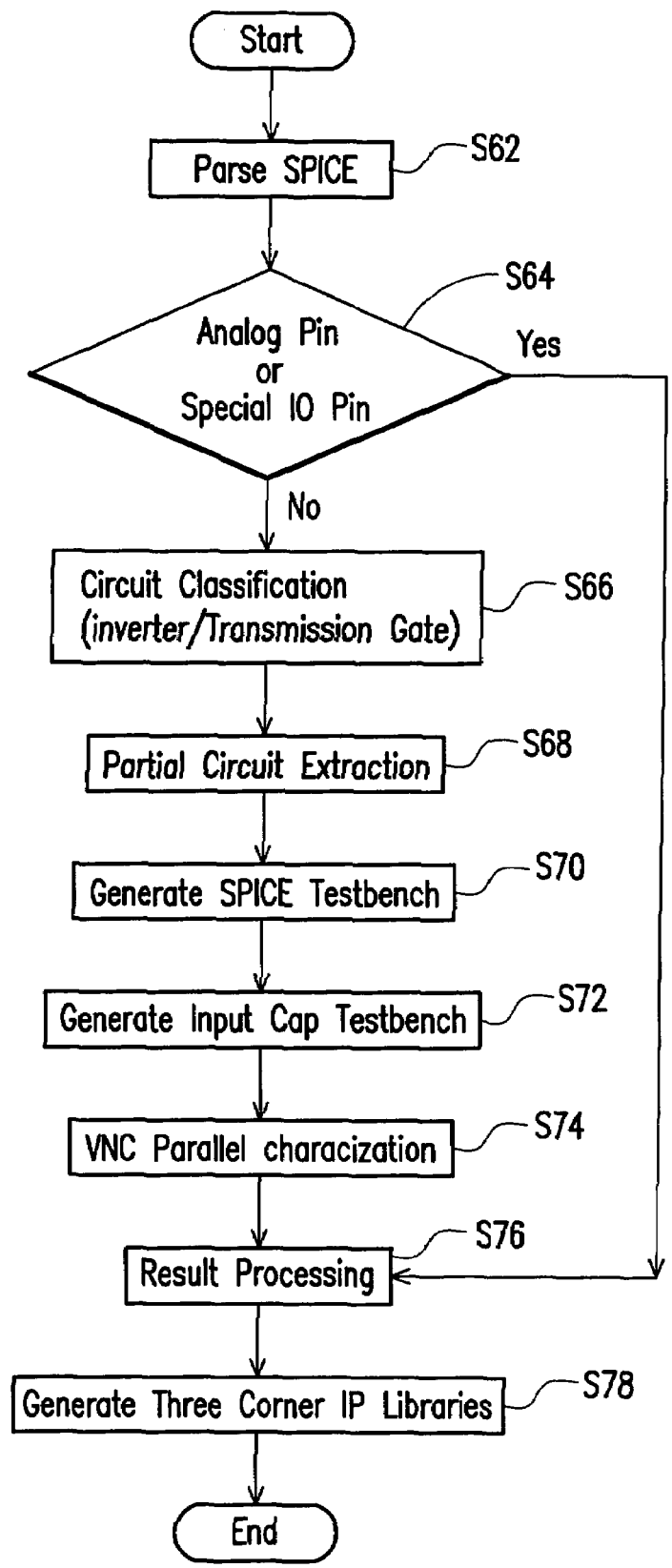
FIG. 6 shows a flowchart of input capacitance and maximum loading search for IPs according another embodiment of the invention.

FIG. 6 shows the methodology flow for finding the input cap and max loading of an IP component.

The step of parsing SPICE, S62, adjusts SPICE model to map the voltage level to specified technologies. It removes dummy resistors from the extracted SPICE codes. If there are trimming resistors, the trimming resistors are floated or shorted. It also extracts the power/ground information. It also extracts the IP's passing parameter for testbench instantiation. The spice codes are lumped Layout parasitic Extraction (LPE) SPICE. In other words, all coupling capacitances are lumped together. The ESD (Electrical Static Device) devices are lumped together into a single capacitor and diodes. They are extracted to the testbench as well.

In Step S64, all input pins and IO pins are looped and the analog pins and special IO pins are skipped without characterization. The characterization is only concerned about pins with digital signals. Hence, special IO pins, such as those for reference signal or special resistor configuration, are ignored.

In Step S66, the first layer of circuit is recognized as inverter or transmission gate, as described above. In Step S68, partial circuit extraction is performed as described above. If the first layer is recognized as an inverter, then the second layer may be determined as another inverter. If the first layer is recognized as a transmission gate, then the second layer may be determined as a capacitor.

In Step S70, SPICE testbench is generated based on circuit recognition. In Step S72, input capacitance testbench is generated. In Step S74, VNC parallel characterization is performed. In Steps S76 and S78, results are processed to generate three corners IP libraries. The three corners are for example, typical case, best case and worst case.

The input capacitance can be obtained from circuit extraction simulation, for example, as shown in FIGS. 1~3. If the simulation failed to get the result, it will abort the current job, shrink the time scale automatically and return again until the job is concluded.

The following table shows the rule of thumb of run time and accuracy.

| Method | Run time | Accuracy |
|---|---|---|
| Interpolation | <seconds | ~85% |
| Circuit Extraction Simulation | Seconds to minutes | 90%-100% |
| IO Instance Based Simulation | Minutes to hours | >95% |
| Full Chip Simulation | Hours to months | 100% or 0% if failed |

The device extraction and the SPICE simulation have been proven to be successful by 1149 IPs implemented as the test cases. Due to run-time consideration, it is unable to compare the accuracy among all these IPs. As a rule of thumb, however, the accuracy is around 90%-100% according to some selected IPs and designers' judgment.

The following tables shows runtime and accuracy comparison for input pin CLK of ADC. Wherein, "FIP" refers to Full IP Simulation; "PCS" refers to "Circuit Extraction Simulation"; "LPE" refers to "Layout Parasitic Extraction"; "TC" refers to Typical Corner; "WC" refers to Worst Corner and "BC" refers to Best Corner.

| Pin | Method | Corner | Input Cap (pf) | Runtime (s) | Accuracy |
|---|---|---|---|---|---|
| CLK | FIP | BC | 0.2009 | 2814567.52 | 100% |
| CLK | CES | BC | 0.1913 | 2.87 | 95.2% |
| CLK | FIP | TC | 0.1870 | 2389748.37 | 100% |
| CLK | CES | TC | 0.1693 | 2.42 | 90.5% |
| CLK | LPE | TC | 0.192047 | 90.02 | 103% |
| CLK | FIP | WC | 0.1806 | 2073361.24 | 100% |
| CLK | CES | WC | 0.1680 | 2.35 | 93% |

The following table shows the runtime and accuracy comparison of output pin DI0 of ADC.

| Pin | Method | Corner | Output Cap (pf) | Runtime (s) | Accuracy |
|---|---|---|---|---|---|
| DI0 | FIP | BC | 18.4865 | 2464756.21 | 100% |
| DI0 | CES | BC | 19.5033 | 1.08 | 105.5% |
| DI0 | FIP | TC | 6.98590 | 2687921.72 | 100% |
| DI0 | CES | TC | 7.23863 | 1.90 | 104.3% |
| DI0 | FIP | WC | 3.49277 | 2571362.31 | 100% |
| DI0 | CES | WC | 3.58009 | 1.82 | 102.5% |

The embodiment of the present invention proposes a fast and generic working methodology flow for Input Capacitance and Max Output Capacitance of IP components with partial circuit extraction and simulation. With this Methodology/Algorithm, the run-time is tremendously cut down from weeks into seconds. The accuracy for the input capacitance is 90% or above within the acceptance of the designer. More than 1500 test cases (counted by pin) are used in combination with 250 IPs for different technologies to validate the methodology/algorithm, which forms an essential part of the IP characterization methodology flow. By now, it has been fully verified by all IPs under 0.18 μm (or below) process technology for both regular power and low leakage libraries.

Currently, IPs subject to characterization are listed in the following table.

| No | IP | Description |
|---|---|---|
| 1 | ADC | Analog-to-Digital Converter |
| 2 | DAC | Digital-to-Analog Converter |
| 3 | BG | Bandgap Voltage Reference |
| 4 | CMP | Comparator |
| 5 | DEL | Delay Cell |
| 6 | DLL | Delay-Locked Loop |
| 7 | LVR | Low Voltage Differential Signal Receiver |
| 8 | OSC | Oscillator |
| 9 | PLL | Phase-Locked Loop |
| 10 | POR | Power-On High/Low Reset |
| 11 | PWM | Charge Pump Circuit (Pulse Width Modulator) |
| 12 | VDT | Voltage Detector |
| 13 | USB/OTG | Universal Serial Bus/On The Go |
| N/A | N/A | N/A |

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A methodology for characterization of an IP (Intellectual Property) component, comprising:
   recognizing input pins among digital pins;
   classifying first layers of the IP component based on the input pins, wherein the first layers are first circuit stages of the IP component;
   extracting second layers of the IP component, wherein the second layers are second circuit stages of the IP component;
   simulating the IP component based on the first and second layers of the IP component; and
   generating an IP library,
   wherein one of the first layers and one of the second layers corresponding to each other are recognized as both inverters if the input pin corresponding to the one of the first layers is connected to a gate terminal of the one of the first layers, and the one of the first layers and the one of the second layers corresponding to each other are recognized as a transmission gate and a capacitor respectively if the input pin corresponding to the one of the first layers is connected to one of source and drain terminals of the one of the first layers.

2. The methodology of claim 1, further comprising:
   cleaning up simulation by removing correction of power setup and floating resistors.

3. The methodology of claim 1, further comprising:
   generating a simulation testbench.

4. The methodology of claim 1, further comprising:
   generating a maximum capacitance testbench.

5. The methodology of claim 1, further comprising:
   skipping analog pins and special IO pins without characterization.

6. The methodology of claim 1, further comprising:
   looping for all input pins and IO pins before classifying the first layer.

7. The methodology of claim 1, wherein the step of generating an IP library comprises:
   generating three corners of the IP library.

8. A methodology for estimating an input capacitance of an IP (Intellectual Property) component, comprising:
   selecting input pins among digital pins;
   identifying connection of input pins to extract first and second layers of the IP component, wherein the first and second layers are first and second circuit stages of the IP component, one of the first layers and one of the second layers corresponding to each other are extracted as both inverters if the input pin corresponding to the one of the first layers is connected to a gate terminal of the one of the first layers, and the one of the first layers and the one of the second layers corresponding to each other are extracted as a transmission gate and a capacitor respectively if the input pin corresponding to the one of the first layers is connected to one of source and drain terminals of the one of the first layers; and
   finding the input capacitance of the first and second layers by simulation.

9. The methodology of claim 8, further comprising:
   skipping analog pins and special IO pins without characterization.

10. The methodology of claim 8, further comprising:
    neglecting capacitance from a third layer to output pins of the IP component, wherein the third layer is a third circuit stage of the IP component.

11. A methodology for characterization of an IP (Intellectual Property) component, comprising:
    recognizing input pins among digital pins;
    classifying at least one first input layer of the IP component based on the input pins, wherein the first input layer is a first input circuit stage of the IP component;
    extracting at least one second input layer of the IP component, wherein the second input layer is a second input circuit stage of the IP component;
    simulating the IP component based on the first and second input layers of the IP component; and
    generating an IP library,
    wherein the first and second input layers are extracted as both inverters if the input pin corresponding to the first input layer is connected to a gate terminal of the first input layer, and the first and second input layers are extracted as a transmission gate and a capacitor respectively if the input pin corresponding to the first input layer is connected to one of source and drain terminals of the first input layer.

12. The methodology of claim 11, further comprising:
    cleaning up simulation by removing correction of power setup and floating resistors.

13. The methodology of claim 11, further comprising:
    generating a simulation testbench.

14. The methodology of claim 11, further comprising:
    generating a maximum capacitance testbench.

15. The methodology of claim 11, further comprising:
    skipping analog pins and special IO pins without characterization.

16. The methodology of claim 11, further comprising:
    looping for all input pins and IO pins before classifying the first input layer.

17. The methodology of claim 11, wherein the step of generating an IP library comprises:
    generating three corners of the IP library.

18. A methodology for estimating an input capacitance of an IP (Intellectual Property) component, comprising:
    selecting input pins among digital pins;
    identifying connection of input pins to extract at least one first input layers and at least one second input layer of the IP component by extracting the first and second input layers as both inverters if the input pin corresponding to the first input layer is connected to a gate terminal of the first input layer, and extracting the first and second input layers as a transmission gate and a capacitor if the input pin corresponding to the first input layer is connected to one of source and drain terminals of the first input layer, wherein the first and second input layers are first and second input circuit stages of the IP component; and
    finding the input capacitance of the first and second input layers by simulation.

19. The methodology of claim 18, further comprising:
    skipping analog pins and special IO pins without characterization.

20. The methodology of claim 18, further comprising:
    neglecting capacitance from a third layer to output pins of the IP component, wherein the third layer is a third input circuit stage of the IP component.

* * * * *